(12) United States Patent
Hayashi

(10) Patent No.: US 7,340,699 B2
(45) Date of Patent: Mar. 4, 2008

(54) ANALYSIS APPARATUS FOR SEMICONDUCTOR LSI CIRCUIT ELECTROSTATIC DISCHARGE BY CALCULATING INTER-PAD VOLTAGE BETWEEN PADS

(75) Inventor: Sachio Hayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 370 days.

(21) Appl. No.: 10/890,025

(22) Filed: Jul. 12, 2004

(65) Prior Publication Data

US 2005/0146380 A1 Jul. 7, 2005

(30) Foreign Application Priority Data

Jan. 7, 2004 (JP) ............................ P2004-002068

(51) Int. Cl.
*G06F 17/50* (2006.01)
*H01L 23/62* (2006.01)

(52) U.S. Cl. ................. 716/4; 716/1; 716/2; 716/5; 716/11; 257/360

(58) Field of Classification Search .................... 716/1, 716/4, 5, 11; 702/136; 257/361
See application file for complete search history.

(56) References Cited

U.S. PATENT DOCUMENTS

| 3,916,340 | A | * | 10/1975 | Scott ........................ 331/107 S |
| 5,045,913 | A | * | 9/1991 | Masleid et al. ............. 257/409 |
| 6,842,714 | B1 | * | 1/2005 | Acar et al. .................. 702/136 |
| 6,888,201 | B2 | * | 5/2005 | Yu .............................. 257/361 |
| 6,934,924 | B2 | * | 8/2005 | Paul et al. .................... 716/11 |
| 6,983,432 | B2 | * | 1/2006 | Hayes ............................ 716/4 |
| 7,114,137 | B2 | * | 9/2006 | Hayashi .......................... 716/4 |
| 2002/0112212 | A1 | * | 8/2002 | Cohn et al. ..................... 716/1 |
| 2005/0102644 | A1 | * | 5/2005 | Collins et al. ................. 716/11 |
| 2006/0123376 | A1 | * | 6/2006 | Vogel et al. ................... 716/11 |

FOREIGN PATENT DOCUMENTS

| JP | 2000-99554 | 4/2000 |
| JP | 2002-197139 | 7/2002 |
| JP | 2003-233637 | 8/2003 |

OTHER PUBLICATIONS

Li et al., "Substrate resistance modeling and circuit-level simulation of parasitic device coupling effects for CMOS I/O circuits under ESD stress", Oct. 6-8, 1998, Electrical Overstress/Electrostatic Discharge Symposium Proceedings, pp. 281-289.*

(Continued)

*Primary Examiner*—Jack Chiang
*Assistant Examiner*—Helen Rossoshek
(74) *Attorney, Agent, or Firm*—DLA Piper US LLP

(57) ABSTRACT

A semiconductor integrated circuit electrostatic discharge analysis apparatus includes a resistance network generation unit generating a resistance network served as a power supply interconnect equivalent circuit in a logic cell region of a semiconductor LSI circuit based on pitch, width and a sheet resistance of a power supply interconnect; a protection network generation unit generating an electrostatic discharge protection network with pads and protection elements placed in an I/O cell region of the changing semiconductor LSI circuit, connected to the resistance network; and an analysis unit calculating an inter-pad voltage between the pads when electrostatic discharge equivalent current flows between the pads.

19 Claims, 20 Drawing Sheets

OTHER PUBLICATIONS

Wang, "A new design for complete on-chip ESD protection", May 21-24, 2000, Custom Integrated Circuits Conference, CICC. Proceedings of the IEEE 2000, pp. 87-90.*

Tong et al., "Modeling, extraction and simulation of CMOS I/O circuits under ESD stress", May 31-Jun. 3, 1998,Circuits and Systems, 1998. ISCAS '98. Proceedings of the 1998 IEEE International Symposium on, vol. 6, pp. 389-392 vol. 6.*

P. Ngan et al, "Automatic Layout Based Verification Of Electrostatic Discharge Paths," EOS/ESD Symposium, pp. 2A.4.1-2A.4.6, (2001).

Q. Li et al, "Full Chip ESD Design Rule Checking," ISCAS 2001, V-503-V-506, 2001.

Copy of Official Action Letter issued Oct. 2, 2007 in counterpart Japanese application (Application No. 2004002068), with English language translation.

Hiromi Anzai et al., "Investigation Of ESD Protection Device By Circuit Simulator", *Technical Report of IEICE, The Institute of Electronics, Information and Communication Engineers*, VLD99-58, SDM99-133, ICD99-141 (1999-98).

Hiromi Anzai et al., "Investigation Of Equivalent Circuit Model Of ESD Protection Devices", *Technical Report of IEICE, The Institute of Electronics, Information and Communication Engineers*, VLD2002-77, SDM2002-183(2002-10).

* cited by examiner

FIG. 10
| INTERCONNECT LAYER | M1 | M2 | M3 | M4 | M5 | M6 | M7 | M8 |
|---|---|---|---|---|---|---|---|---|
| INTERCONNECT PITCH [um] | 15 | 300 | 300 | 300 | 300 | 300 | 300 | 300 |
| INTERCONNECT WIDTH [um] | 1 | 10 | 10 | 10 | 10 | 10 | 10 | 10 |
| INTERCONNECT DIRECTION | H | V | H | V | H | V | H | V |
FIG. 11A
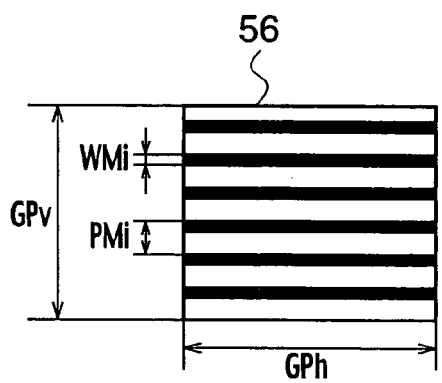
FIG. 11B
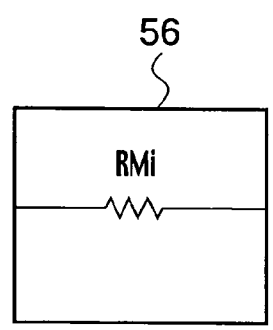
FIG. 12A
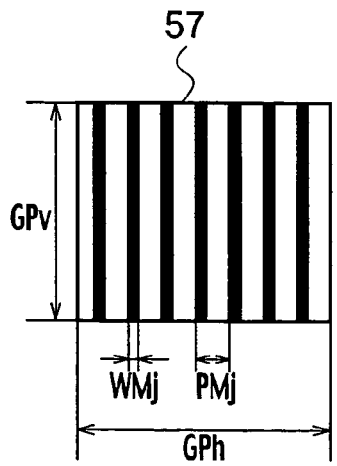
FIG. 12B
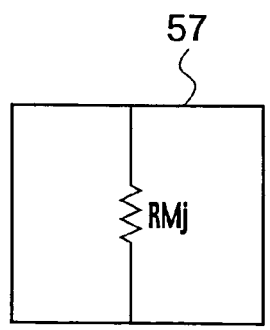

FIG. 16

| <I/O CELL NAME> | <PROTECTION ELEMENT NAME> | <TYPE> | <SIZE> |
|---|---|---|---|
| 101 | PDEV1 | DIODE | 40um |
| 101 | PDEV2 | DIODE | 30um |
| 101 | PDEV3 | GGSCR | 30um |
| 101 | PDEV4 | DTSCR | 30um |
| 101 | PDEV5 | DIODE | 40um |

US 7,340,699 B2

ANALYSIS APPARATUS FOR SEMICONDUCTOR LSI CIRCUIT ELECTROSTATIC DISCHARGE BY CALCULATING INTER-PAD VOLTAGE BETWEEN PADS

CROSS REFERENCE TO RELATED APPLICATIONS

This application is based upon and claims the benefit of priority from prior Japanese Patent Applications No. P2004-2068, filed on Jan. 7, 2004; the entire contents of which are incorporated herein by reference.

BACKGROUND OF THE INVENTION

1. Field of the Invention

The present invention relates to an analysis method for semiconductor LSI circuit electrostatic discharge (ESD) and a program for the same.

2. Description of the Related Art

In order to analyze semiconductor LSI circuit electrostatic discharge a shortest path determination method or a convex flow analysis has been carried out for an electrostatic discharge protection network made up of protection elements and parasitic resistances extracted from a layout of a semiconductor LSI circuit. Inter-pad voltages and current paths when applying ESD current between pads are calculated.

According to this analysis method, analysis is carried out based on a layout. Therefore, that analysis may only be carried out after completion of a layout design. As a result of an analysis, detection of a failure may require considerable back tracking and repeating of the design process. In addition, data must be extracted from a layout, resulting in an increase in data size and difficulty in processing.

SUMMARY OF THE INVENTION

According to an aspect of the present invention, a semiconductor integrated circuit electrostatic discharge analysis apparatus is provided. This apparatus includes a resistance network generation unit that generates a resistance network, which is a power supply interconnect equivalent circuit, in a logic cell region of a semiconductor LSI circuit based on an interconnect pitch, an interconnect width, and a sheet resistance of a power supply interconnect; a protection network generation unit that generates an electrostatic discharge protection network with a pad and a protection element, which are placed in an I/O cell region of the semiconductor LSI circuit, connected to the resistance network; and an analysis unit that, when electrostatic discharge equivalent current flows between pads, calculates an inter-pad voltage therebetween.

According to another aspect of the present invention, a computer implemented method of analyzing semiconductor integrated circuit electrostatic discharge is provided. This method includes generating a resistance network, which is a power supply interconnect equivalent circuit, in a logic cell region of a semiconductor LSI circuit based on an interconnect pitch, an interconnect width, and a sheet resistance of a power supply interconnect; generating a electrostatic discharge protection network with a pad and a protection element, which are placed in an I/O cell region of the semiconductor LSI circuit, connected to the resistance network; and calculating an inter-pad voltage when electrostatic discharge equivalent current flows between the pads.

According to still another aspect of the present invention, a computer program product for analyzing a semiconductor integrated circuit electrostatic discharge is provided. This computer program includes an instruction to generate grids of the resistance network with the horizontal grid interval and the vertical grid interval in the logic cell region; an instruction to calculate horizontally combined resistance of the horizontal resistance cells from the horizontally running interconnect layers to which a power supply interconnect of the semiconductor LSI circuit belongs; an instruction to calculate vertically combined resistance of the vertical resistance cells from the vertically running interconnect layers; and an instruction to place horizontally combined resistance along a horizontal line of the grids, and vertically combined resistance along a vertical line of the grids.

BRIEF DESCRIPTION OF THE DRAWINGS

FIG. 10 is an internal power supply grid information table;

FIGS. 11A and 11B are diagrams for describing a horizontally combined resistance calculation method;

FIGS. 12A and 12B are diagrams describing a vertically combined resistance calculation method;

FIG. 16 is a protection element information table;

DETAILED DESCRIPTION OF THE INVENTION

Figure 1:
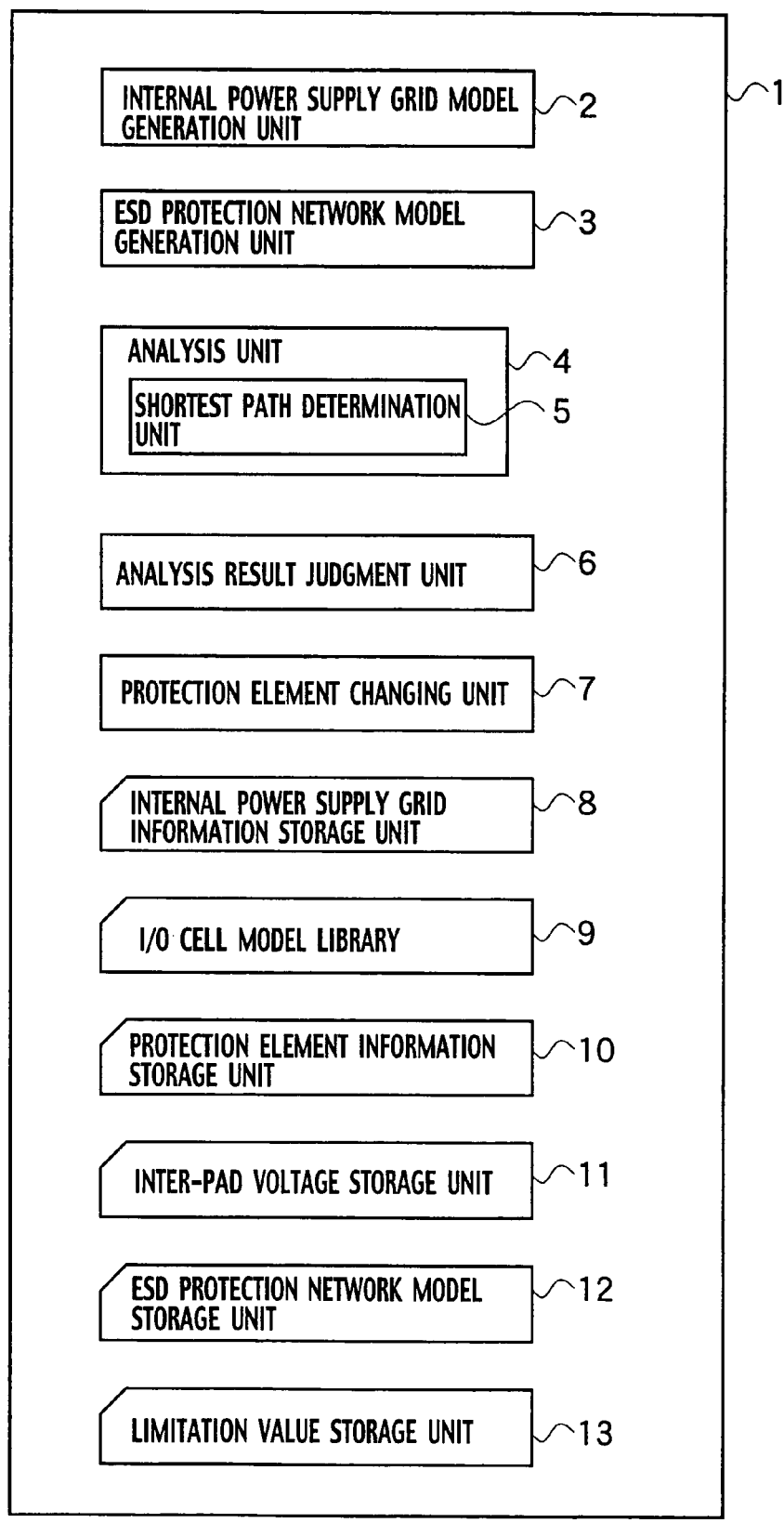
FIG. 1 is a block diagram of a semiconductor LSI circuit electrostatic discharge analysis apparatus according to a first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 1, a semiconductor LSI circuit electrostatic discharge analysis apparatus 1, according to a first embodiment of the present invention, includes an internal power supply grid model generation unit 2, an ESD protection network model generation unit 3, an analysis unit 4, an analysis result judgment unit 6, a protection element changing unit 7, an internal power supply grid information storage unit 8, an I/O cell model library 9, a protection element information storage unit 10, an inter-pad voltage storage unit 11, an ESD protection network model storage unit 12, and a limitation value storage unit 13.

Figure 2:
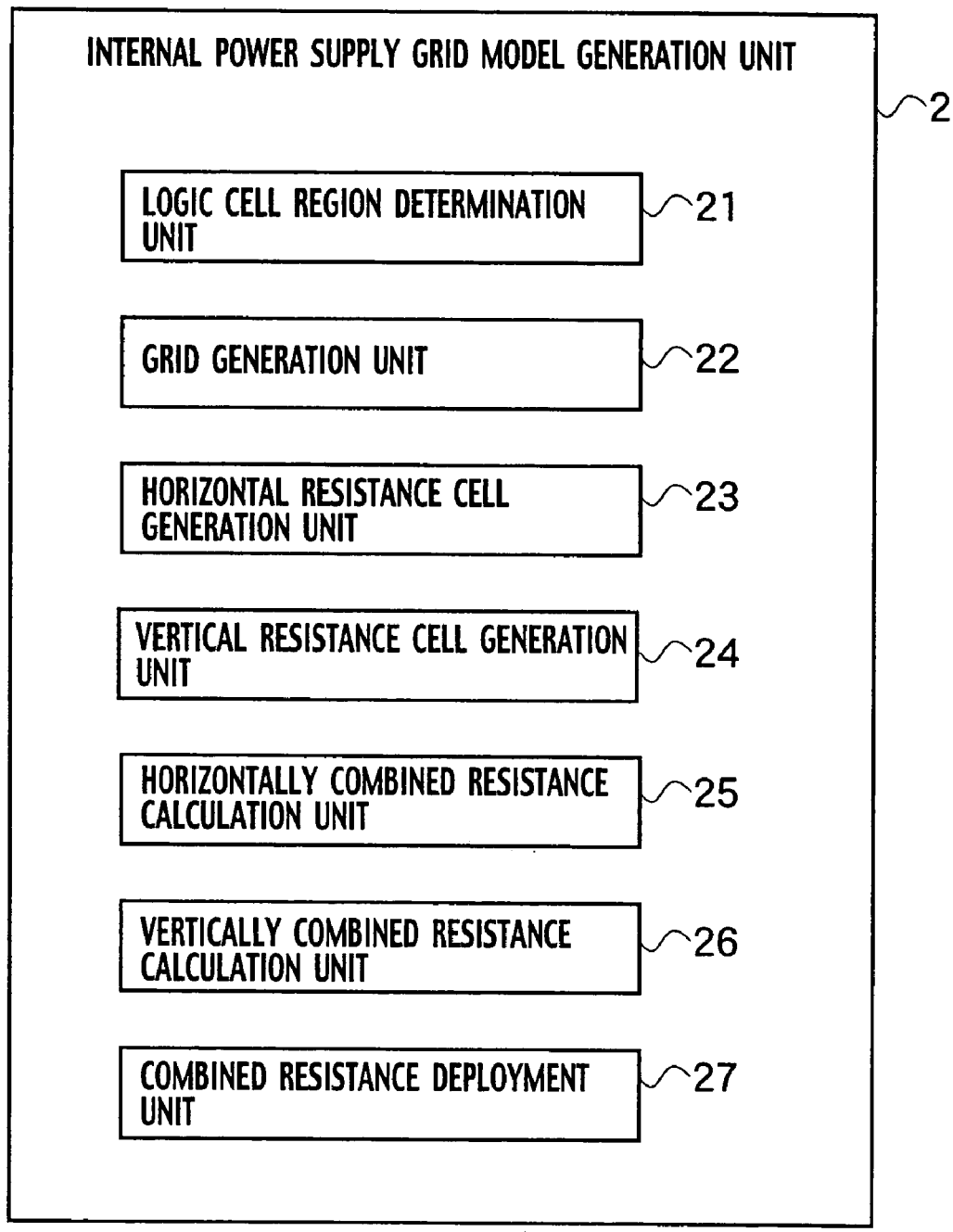
FIG. 2 is a block diagram of an internal power supply grid model generation unit in the analysis apparatus of the first embodiment.

The internal power supply grid model generation unit 2 generates resistance networks or power supply interconnect equivalent circuits in a logic cell region of a semiconductor LSI circuit based on an interconnect pitch, an interconnect width, and a sheet resistance of power supply interconnects. As shown in FIG. 2, the internal power supply grid model generation unit 2 includes a logic cell region determination unit 21, a grid generation unit 22, a horizontal resistance cell generation unit 23, a vertical resistance cell generation unit 24, a horizontally combined resistance calculation unit 25, a vertically combined resistance calculation unit 26, and a combined resistance deployment unit 27.

Figure 3:
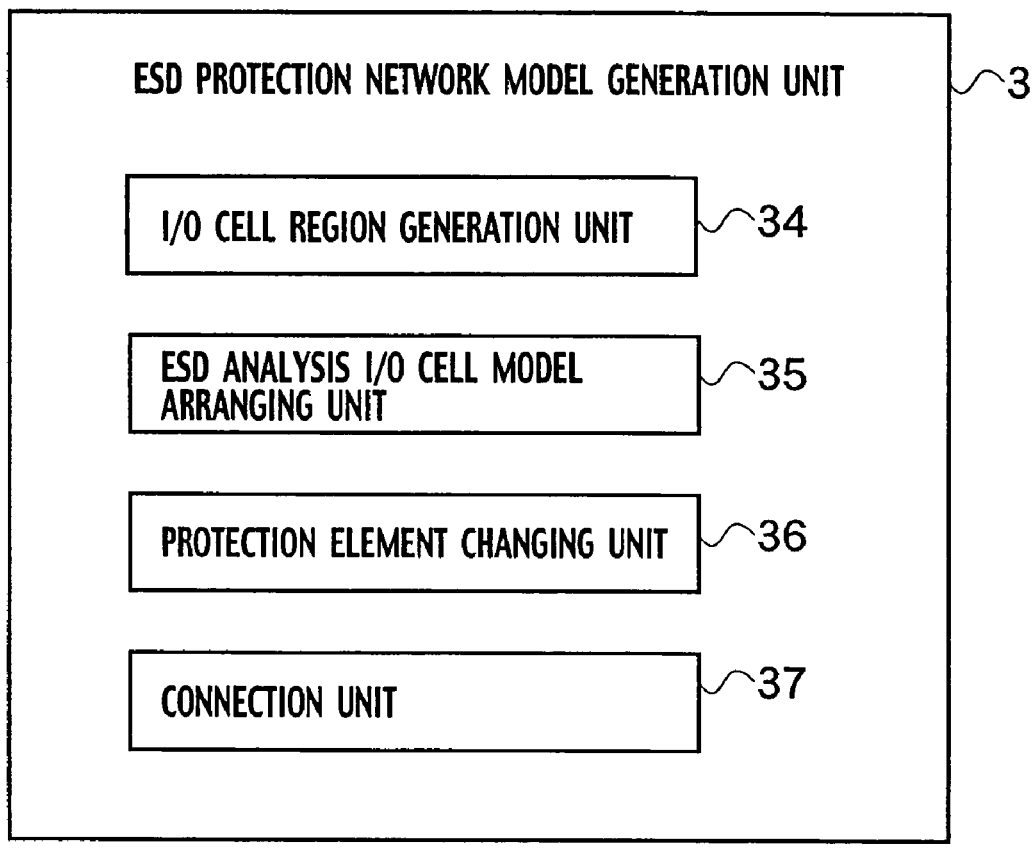
FIG. 3 is a block diagram of an ESD protection network model generation unit in the analysis apparatus of the first embodiment.

The ESD protection network model generation unit 3 generates ESD protection networks that connect pads and protection elements placed in a semiconductor LSI circuit I/O cell region to resistance networks. As shown in FIG. 3, the ESD protection network model generation unit 3 includes an I/O cell region generation unit 34, an ESD analysis I/O cell model arranging unit 35, a protection element changing unit 36, and a connection unit 37.

The analysis unit 4 calculates inter-pad voltages when ESD equivalent current flows between pads. In addition, the analysis unit 4 includes a shortest path determination unit 5.

The semiconductor LSI circuit electrostatic discharge analysis apparatus 1 may be a computer; and the semiconductor LSI circuit electrostatic discharge analysis apparatus 1 may be implemented by instructing a computer to execute instructions in a program.

Figure 4:
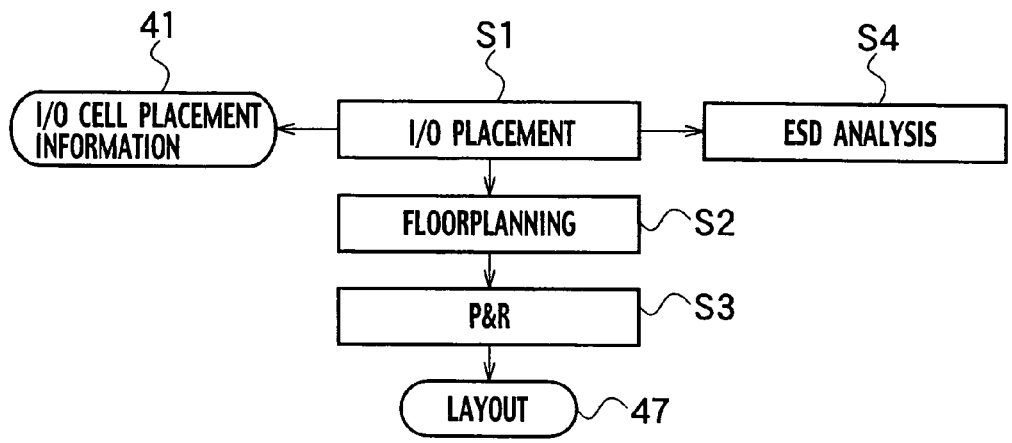
FIG. 4 is part of a semiconductor LSI circuit design flow.

As shown in FIG. 4, according to a semiconductor LSI circuit design flow, I/O cell types and regions to be arranged or placed are determined in step S1, block types and regions to be arranged or placed are determined in step S2, standard cell types and regions to be arranged or placed and interconnects are determined in step S3, completing a layout 47. In step S1, I/O cell placement information 41 is output. The I/O cell placement information 41 includes I/O cell types and regions to be arranged or placed. A semiconductor LSI circuit electrostatic discharge analysis method in step S4, according to the first embodiment of the present invention, is carried out following step S1. The analysis method in step S4 may be implemented without waiting for an output of a layout.

Figure 5:
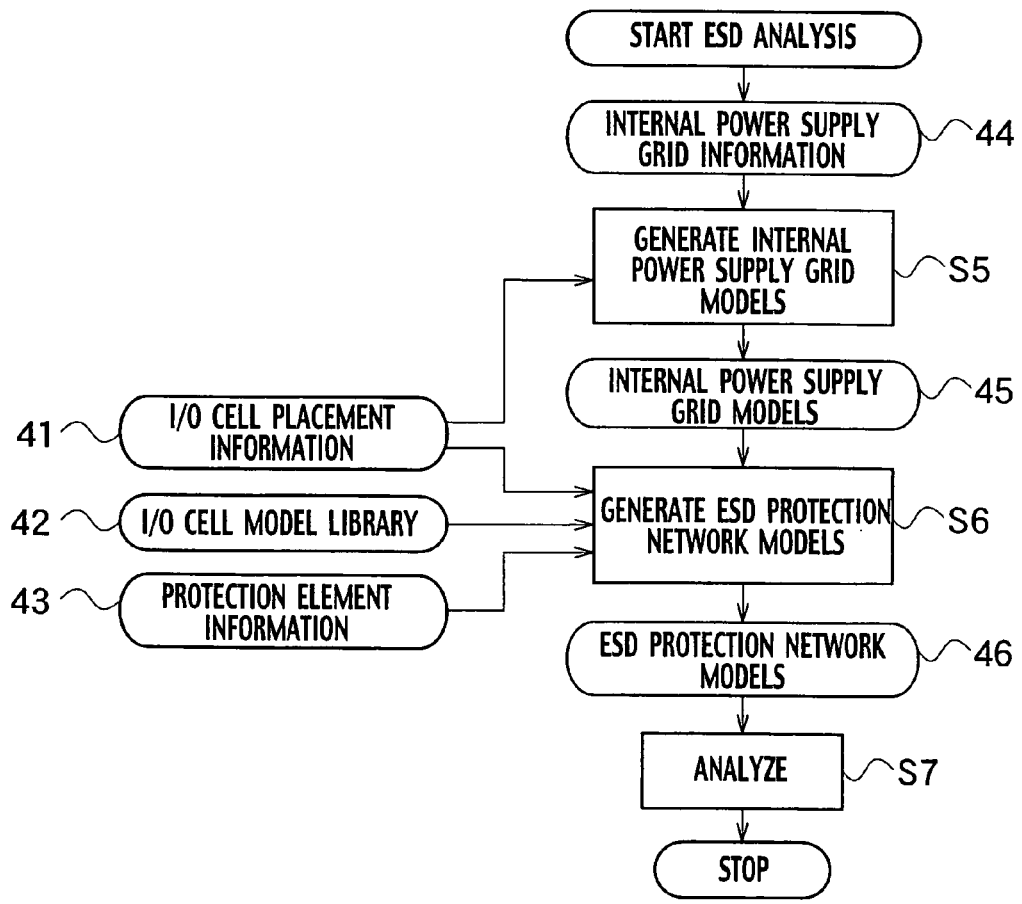
FIG. 5 is a flowchart for a semiconductor LSI circuit electrostatic discharge analysis method according to the first embodiment.

As shown in FIG. 5, according to the semiconductor LSI circuit electrostatic discharge analysis method in step S4 of the first embodiment of the present invention, in step S5, the internal power supply grid model generation unit 2 in FIG. 1 generates internal power supply grid models based on internal power supply grid information 44 and the I/O cell placement information 41.

In step S6, the ESD protection network model generation unit 3 generates ESD protection network models based on the I/O cell placement information 41, an I/O cell model library 42, and protection element information 43. In step S7, the analysis unit 4 carries out ESD analysis for the ESD protection network models. The semiconductor LSI circuit electrostatic discharge analysis method in step S4 is then completed. Next, steps S5 through S7 are described forthwith in detail.

Note that the semiconductor LSI circuit electrostatic discharge analysis method in step S4 may be implemented using a computer executable semiconductor LSI circuit electrostatic discharge analysis program as instructions. The semiconductor LSI circuit electrostatic discharge analysis method may be implemented by instructing a computer to execute that semiconductor LSI circuit electrostatic discharge analysis program.

Figure 6:
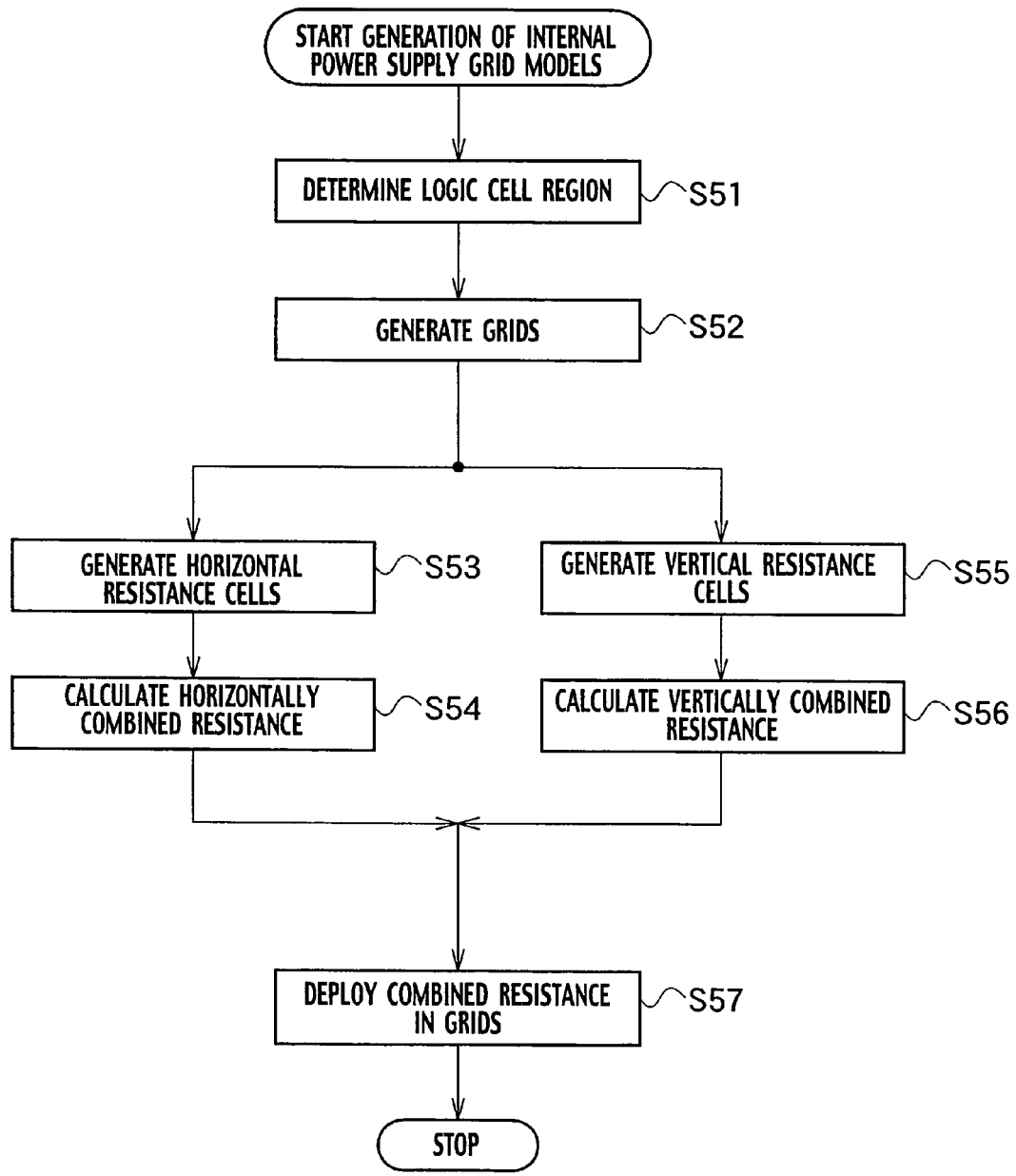
FIG. 6 is a flowchart for internal power supply grid model generation steps of the analysis method of the first embodiment.
Figure 7:
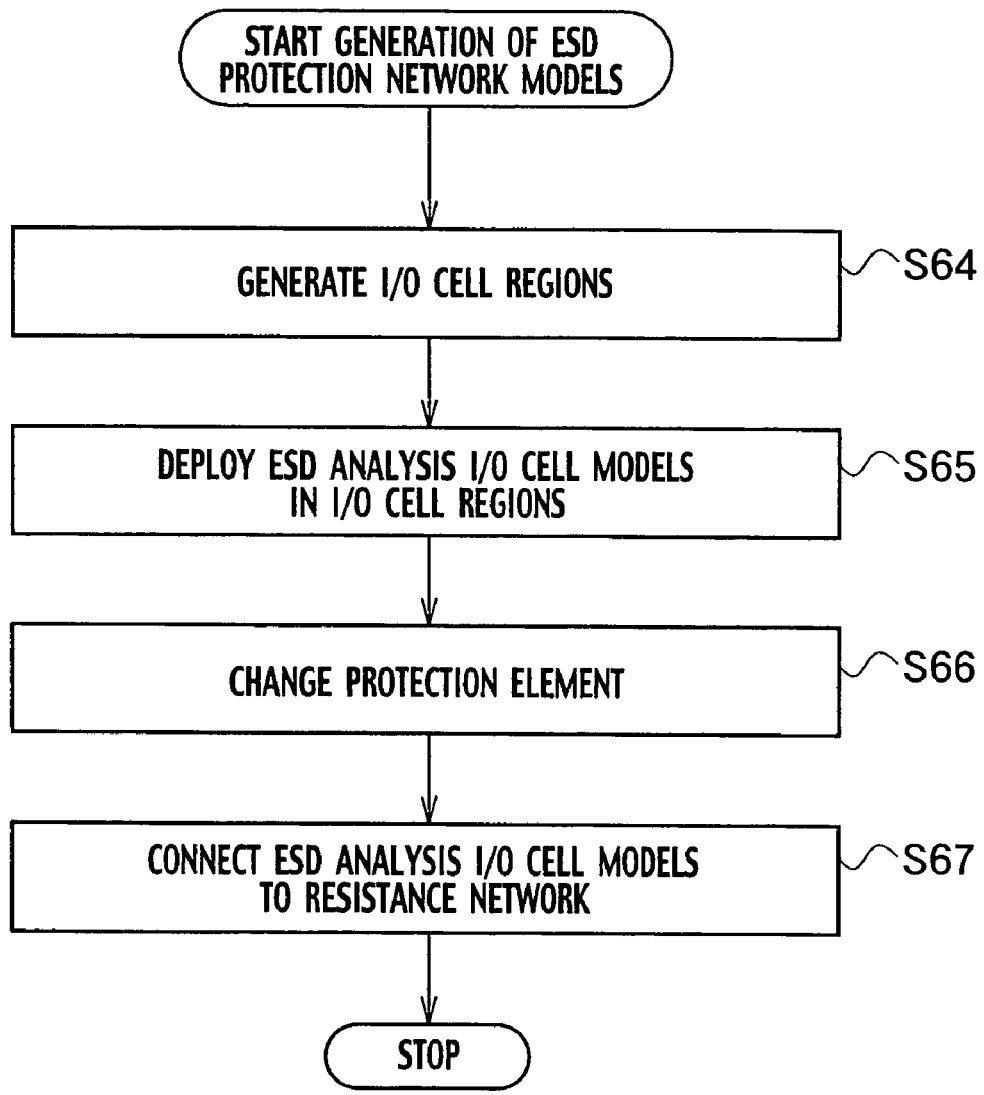
FIG. 7 is a flowchart for ESD protection network model generation steps of the analysis method of the first embodiment.
Figure 8:
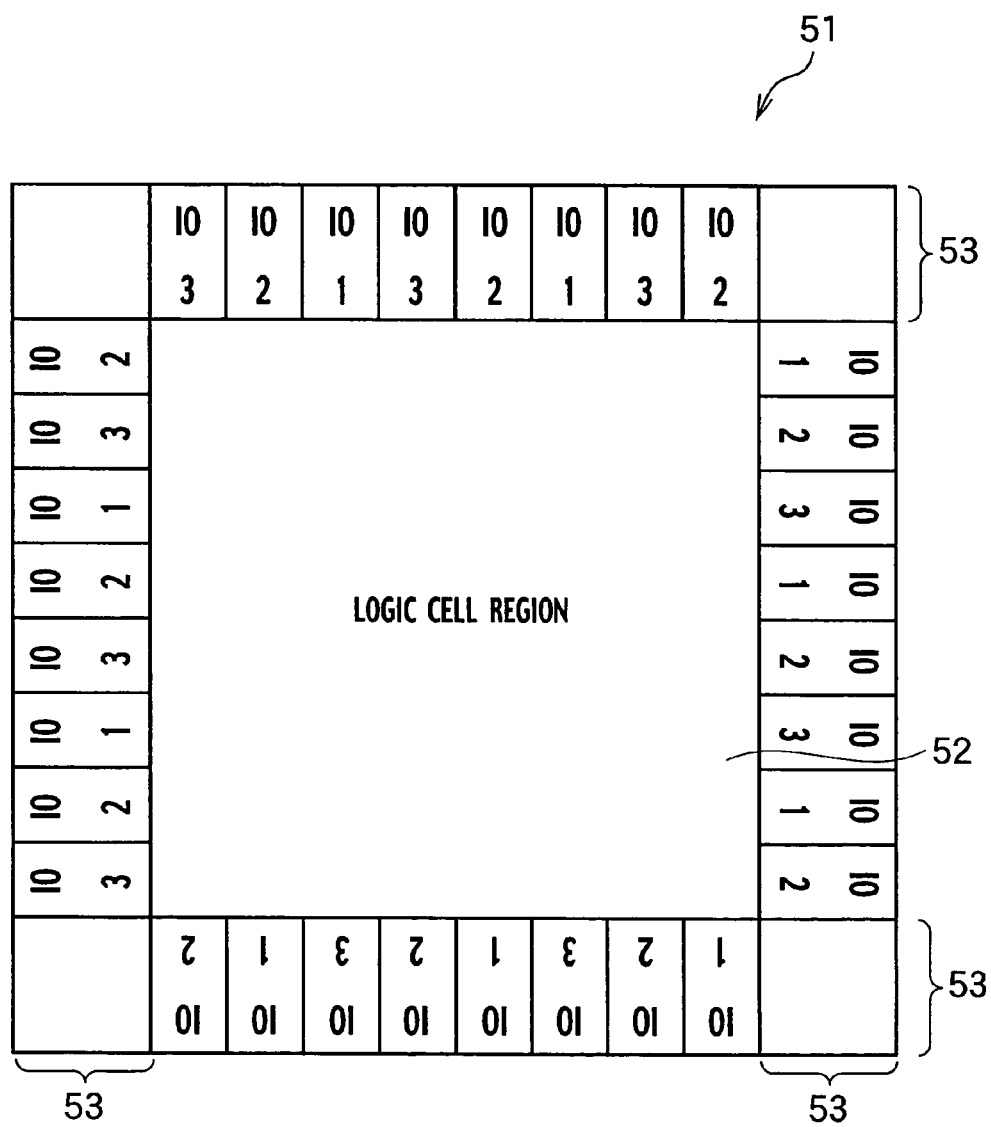
FIGS. 8 and 9 are layouts of a semiconductor LSI circuit.

As shown in FIG. 6, for generation of internal power supply grid models in step S5, to begin with, in step S51, the logic cell region determination unit 21 in FIG. 2 determines a logic cell region 52 in FIG. 8. A semiconductor LSI circuit region 51 includes the logic cell region 52 and I/O cell regions 53. The logic cell region 52 is surrounded by the I/O cell regions 53. As a result, determination of regions in which I/O cells IO1 to IO3 are placed, based on the I/O cell placement information 41, allows determination of the I/O cell regions 53, which are the sum of regions of I/O cells IO1 to IO3, and determination of a region surrounded by the I/O cell regions 53 as the logic cell region 52.

Figure 9:
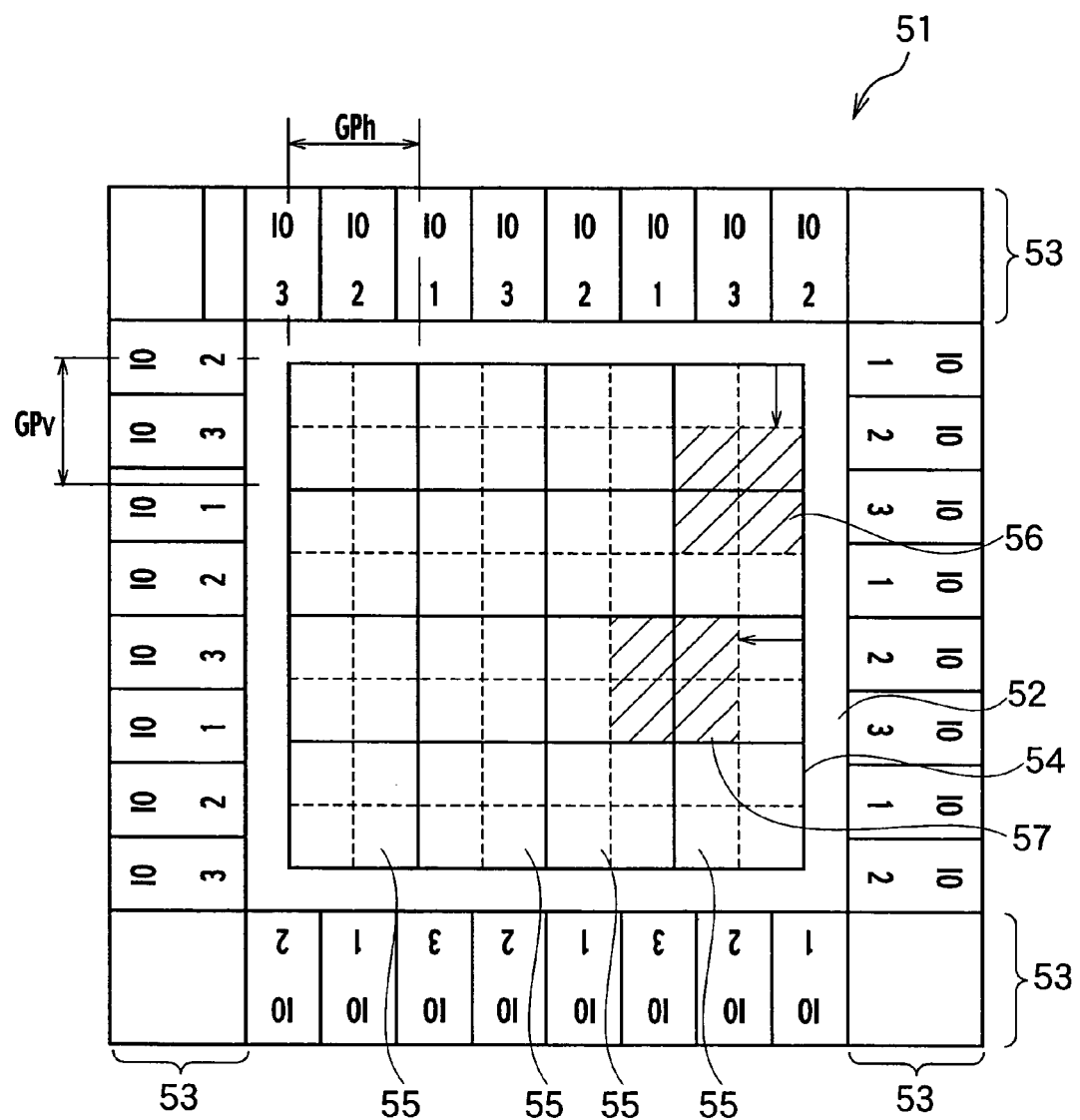

In step S52, the grid generation unit 22 generates grids of the resistance network 54 such that the horizontal width of the grids is equal to a horizontal grid interval GPh and the vertical width of the grids is equal to a vertical grid interval GPv in the logic cell region 52, as shown in FIG. 9.

In step S53, the horizontal resistance cell generation unit 23 deploys horizontal resistance cells 56 in a position to which unit cells 55 of grids in the resistance network 54 are vertically shifted by half a grid. The horizontal width of the horizontal resistance cells 56 is equal to the horizontal grid interval GPh, and the vertical width is equal to the vertical grid interval GPv.

In step S55, the vertical resistance cell generation unit 24 deploys vertical resistance cells 57 in a position to which unit cells 55 are horizontally shifted by half a grid. The horizontal width of the vertical resistance cells 57 is equal to the horizontal grid interval GPh, and the vertical width is equal to the vertical grid interval GPv.

In step S54, the horizontally combined resistance calculation unit 25 calculates a horizontally combined resistance Rh of the horizontal resistance cells 56 from the power supply interconnect layers M1, M3, M5, and M7 whose direction is horizontal based on the internal power supply grid information 44. The internal power supply grid information storage unit 8 in FIG. 1 stores an interconnect pitch, an interconnect width, and an interconnect direction for each of power supply interconnect layers M1 through M8 as the internal power supply grid information 44, as shown in FIG.

10, where H denotes the horizontal direction, and V denotes the vertical direction. As shown in FIGS. 11A and 11B, assuming that each of the horizontal power supply interconnect layers M1, M3, M5, and M7 is represented by Mi, the combined resistance RMi of the horizontal resistance cells 56 of the power supply interconnect in a single layer Mi can be calculated using Expression (1). The horizontally combined resistance Rh can be calculated using Expression (2) for parallel connection of the combined resistances RMi of all layers Mi or the layers M1, M3, M5, and M7 of the same horizontal resistance cells 56.

$$RMi = RsMi \cdot GPh/(GPv \cdot WMi/PMi) \quad (1)$$

$$Rh = 1/\Sigma_i(1/RMi) \quad (2)$$

where RsMi denotes a layer Mi sheet resistance, WMi denotes a layer Mi interconnect width, and PMi denotes a layer Mi interconnect pitch.

In step S56, the vertically combined resistance calculation unit 26 calculates vertically combined resistance Rv of the vertical resistance cells 57 from the power supply interconnect layers M2, M4, M6, and M8 whose direction is vertical. As shown in FIGS. 12A and 12B, assuming that each of the vertical power supply interconnect layers M2, M4, M6, and M8 is Mj, the combined resistance RMj of the vertical resistance cells 57 of the power supply interconnect in a single layer Mj can be calculated using Expression (3). The vertically combined resistance Rv can be calculated using Expression (4) for parallel connection of the combined resistances RMj of all layers Mj or the layers M2, M4, M6, and M8 in the same vertical resistance cells 57.

$$RMj = RsMj \cdot GPv/(GPh \cdot WMj/PMj) \quad (3)$$

$$Rv = 1/\Sigma_j(1/RMj) \quad (4)$$

where, RsMj denotes a layer Mj sheet resistance, WMj denotes a layer Mj interconnect width, and PMj denotes a layer Mj interconnect pitch.

Figure 13:
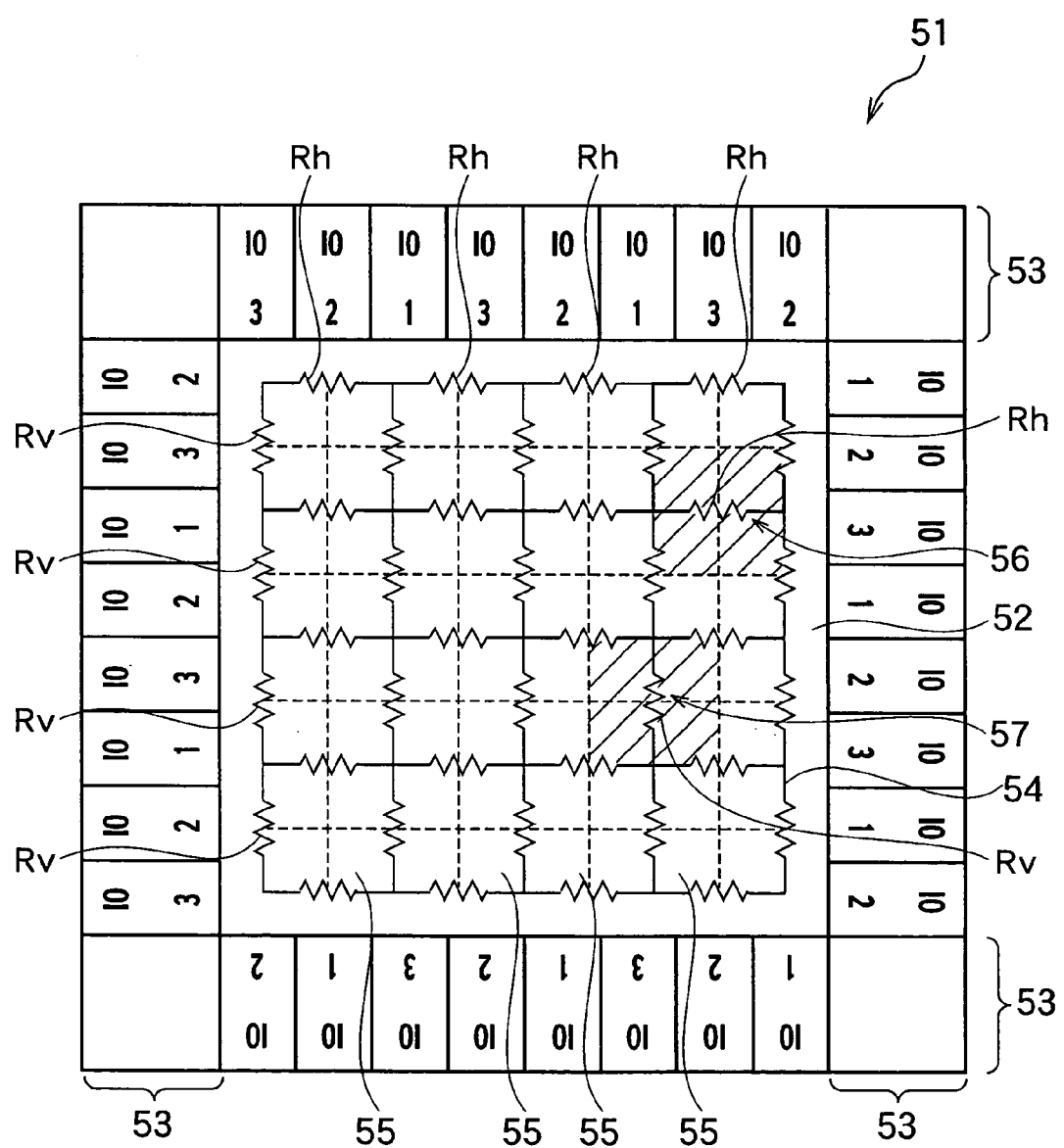
FIGS. 13 and 14 are layouts of a semiconductor LSI circuit on which internal power supply grid models are placed.

As shown in FIG. 13, in step S57, the combined resistance deployment unit 27 deploys the horizontally combined resistances Rh along the horizontal sides of the unit cells 55, which overlaps the horizontal resistance cells 56. The combined resistance deployment unit 27 deploys the vertically combined resistances Rv along the vertical sides of the unit cells 55, which overlaps the vertical resistance cells 57.

Figure 14:
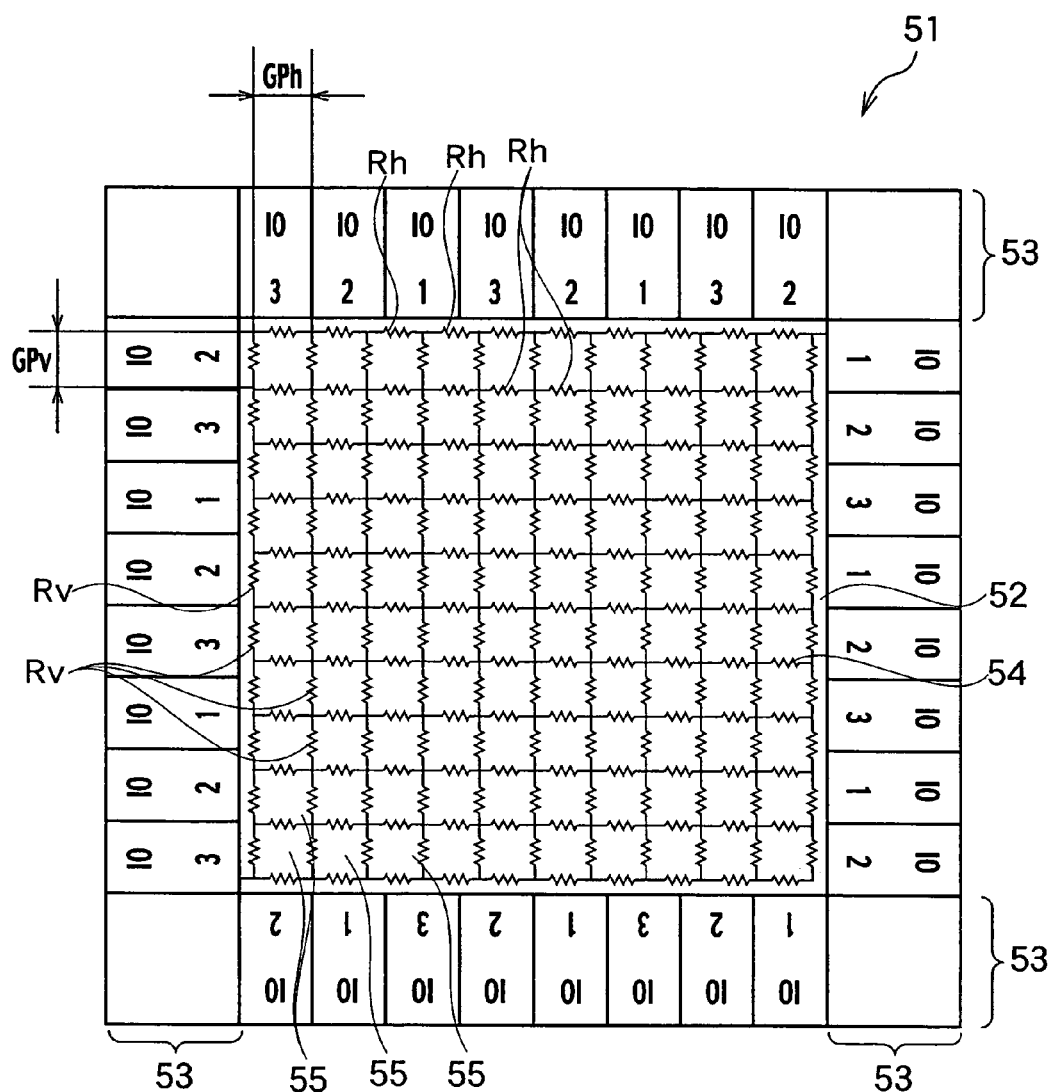

The resistance network 54 or the internal power supply grid model is then complete. Note that the resistance network 54 is made up of a power supply resistance network or a power supply interconnect equivalent circuit to which the power supply potential can be set, and a ground resistance network or a power supply interconnect equivalent circuit to which the ground potential can be set. In other words, the resistance network 54 is generated for each of the power supply potential interconnect and the ground potential interconnect. In addition, as shown in FIG. 14, in step S52, the grid generation unit 22 can set arbitrary values to the horizontal grid interval GPh and the vertical grid interval GPv of the resistance network 54, respectively.

Figure 15:
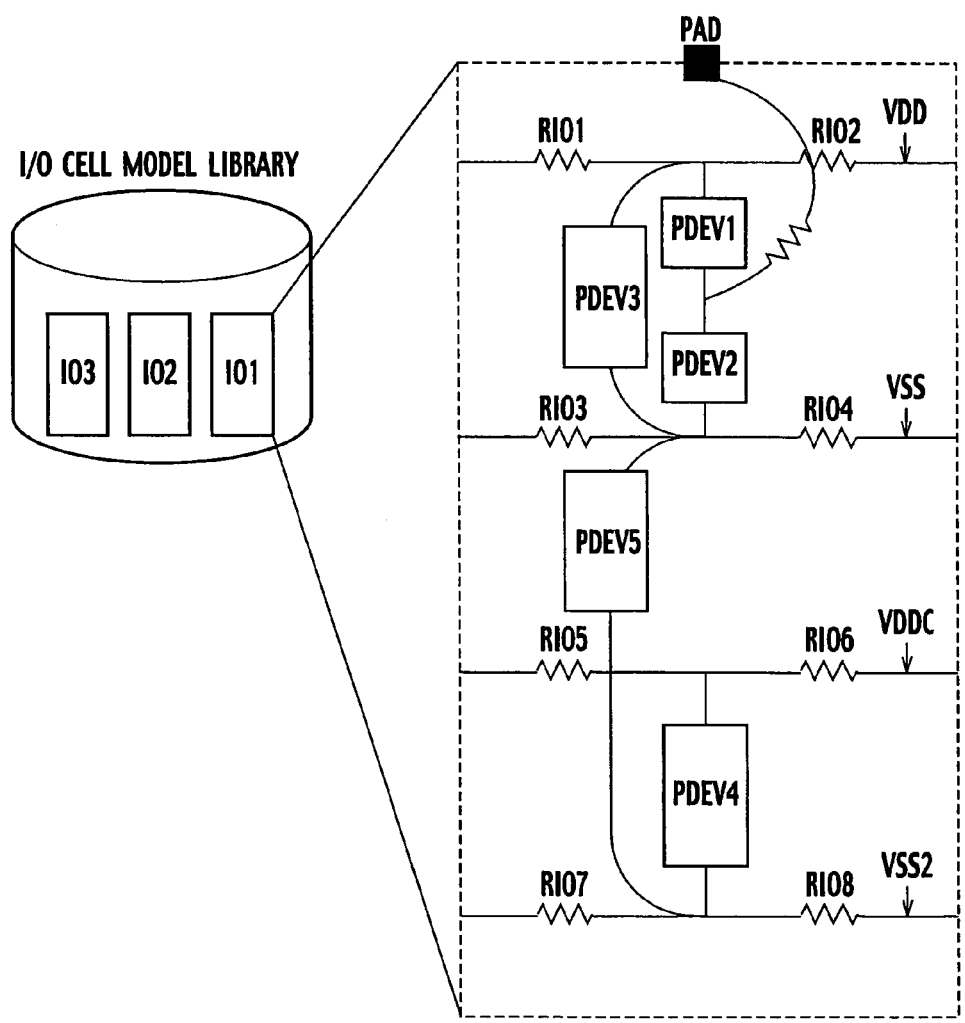
FIG. 15 is a diagram for describing an I/O cell library.

For generation of an ESD protection network model in step S6, to begin with, ESD analysis I/O cell models IO1 to IO3 are generated in advance before proceeding to step S64. As shown in FIG. 15, each of the ESD analysis I/O cell models IO1 to IO3, which are used for a semiconductor LSI circuit, includes distributed resistances RIO1 to RIO8 of power supply rings VDD, VSS, VDDC, and VSS2, which are connected to one another, protection elements PDEV1 to PDEV5, and a pad PAD. In addition, in each of the ESD analysis I/O cell models, the distributed resistances RIO1 to RIO8, the protection elements PDEV1 to PDEV5, and the pad PAD are connected to one another for the resistance network 54. For example, the resistance network 54 is connected to the connection nodes of the distributed resistances RIO7 and RIO8 and the protection elements PDEV4 and PDEV5. In addition, the ESD analysis I/O cell library 9 in FIG. 1 including the ESD analysis I/O cell models IO1 to IO3, which allow reading out those models, is generated and stored in advance. Furthermore, the protection element information 43 as shown in FIG. 16, which allows reading out variable sizes and types of protection elements PDEV1 to PDEV5, is generated and stored in the protection element information storage unit 10 in advance. For example, a protection element PDEV1 in an I/O cell IO1 is a diode (DIODE) type, and the size thereof is 40 μm. Similarly, a protection element PDEV2 in an I/O cell IO1 is a diode (DIODE) type, and the size thereof is 30 μm.

In step S64, the I/O cell region generation unit 34 then generates I/O cell regions 53, which allow placement of the I/O cells IO1 to IO3 based on the I/O cell placement information 41. Note that this step S64 has already been implemented in the course of determining the logic cell region 52 in step S51.

Figure 17:
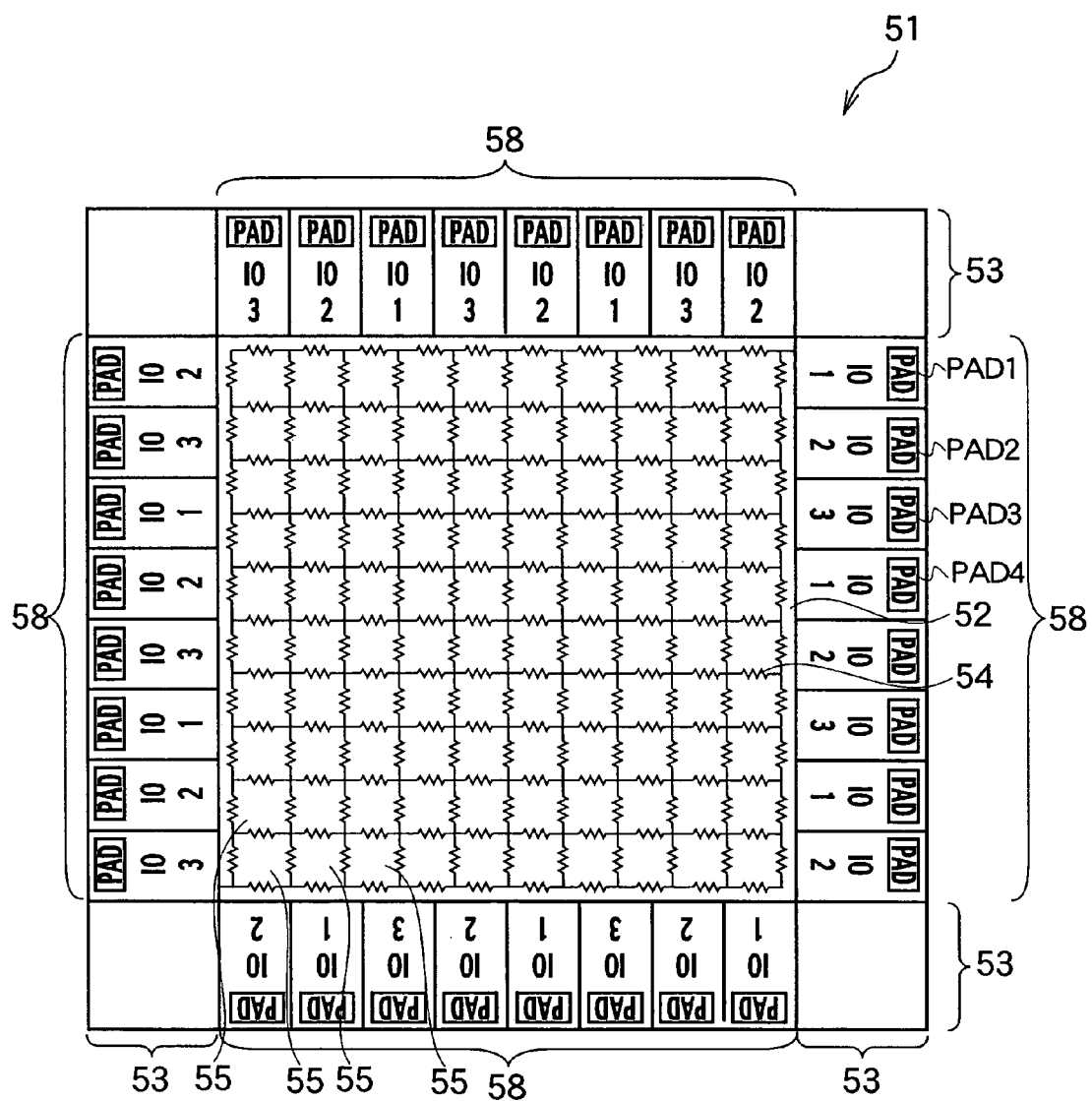
FIG. 17 is a layout of a semiconductor LSI circuit on which ESD protection network models are placed.

As shown in FIG. 17, in step S65, the ESD analysis I/O cell model arranging unit 35 deploys the ESD analysis I/O cell models 58 according to the ESD analysis I/O cell library 9 for the I/O cells IO1 to IO3 in the I/O cell regions 53.

In step S66, the protection element changing unit 36 changes the sizes and types of the protection elements PDEV1 to PDEV5 in the deployed ESD analysis I/O cell models 58 based on the protection element information 43.

In step S67, the connection unit 37 connects the resistance network 54 to the ESD analysis I/O cell models 58 according to the ESD analysis I/O cell library 9. An ESD protection network model 46 with the ESD analysis I/O cell models 58 and the resistance network 54 connected to each other is then complete. That ESD protection network model 46 is stored in the ESD protection network model storage unit 12 in FIG. 1.

Figure 18:
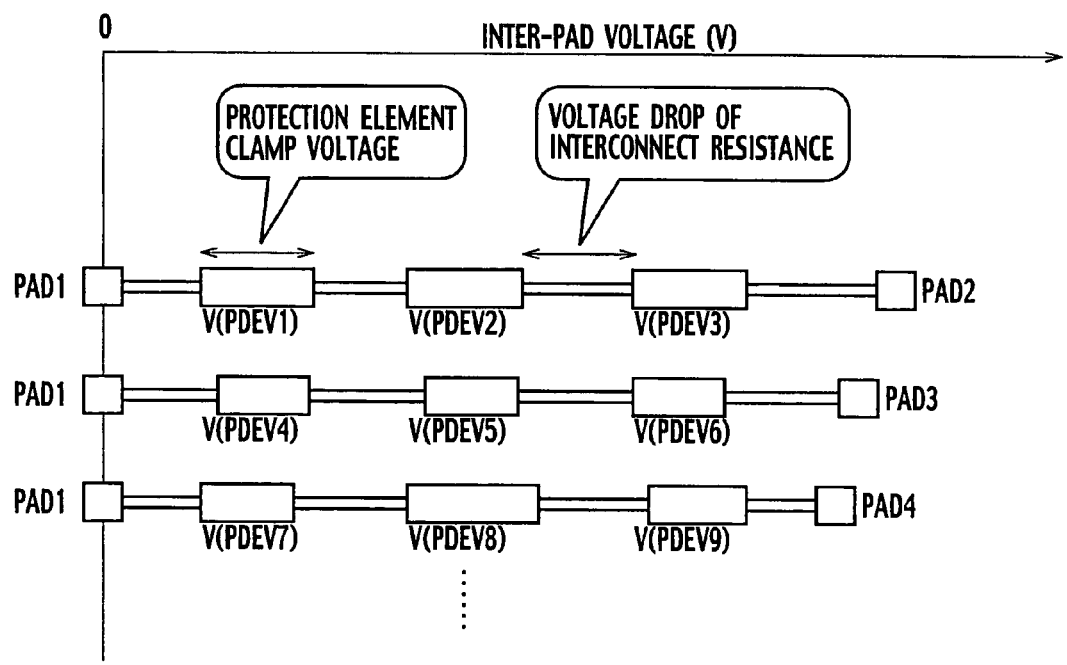
FIG. 18 is a graph showing inter-pad voltages.

Finally, in step S5 of FIG. 5, the analysis unit 4 carries out ESD analysis for the ESD protection network model 46. In order to carry out ESD analysis, as shown in FIG. 18, the shortest path determination unit 5 finds current paths among the pads PAD1 to PAD4, and calculates inter-pad voltages therebetween. For example, the inter-pad current path between the pads PAD1 and PAD2 runs through the pad PAD1, the protection element PDEV1, the protection element PDEV2, the protection element PDEV3, and the pad PAD2. The inter-pad current path between the pads PAD1 and PAD3 runs through the pad PAD1, the protection element PDEV4, the protection element PDEV5, the protection element PDEV6, and the pad PAD3. It is apparent that the inter-pad voltage between the pads PAD1 and PAD2 is higher than that between the pads PAD1 and PAD3.

This allows accurate ESD analysis considering internal power supply interconnect resistance in the design stage of I/O placement. In addition, even if a failure is detected as an analysis result, less back tracking and repeating of the design process is required. Furthermore, since data extraction from a layout is unnecessary, the data size is small so as to allow easy analysis.

Figure 19:
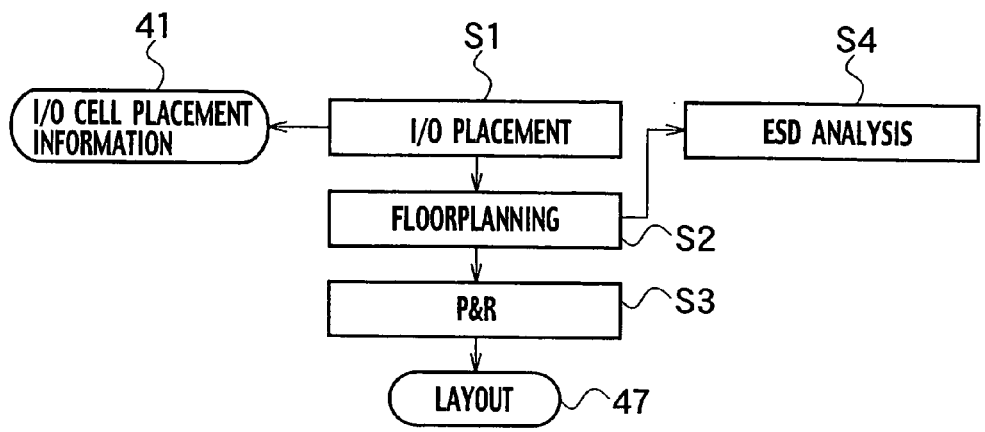
FIG. 19 is part of a semiconductor LSI circuit design flow of a modified example of the first embodiment.
Figure 20:
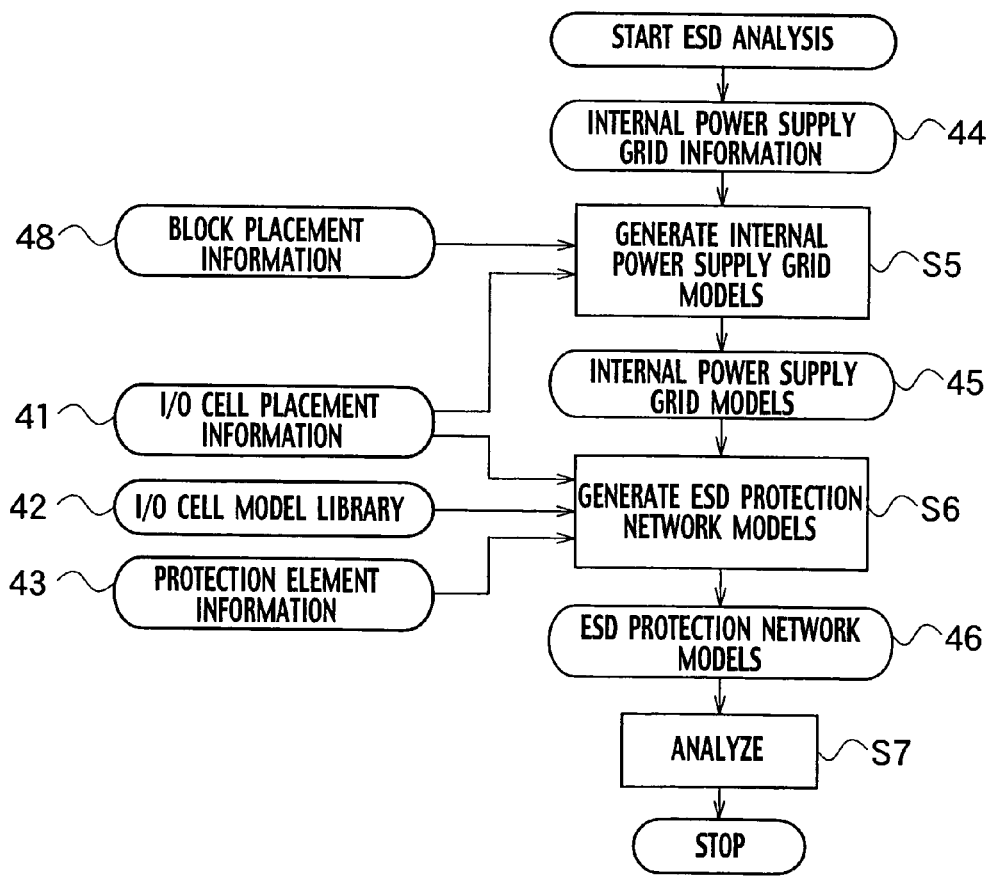
FIG. 20 is a flowchart for a semiconductor LSI circuit electrostatic discharge analysis method according to the modified example of the first embodiment.
Figure 21:
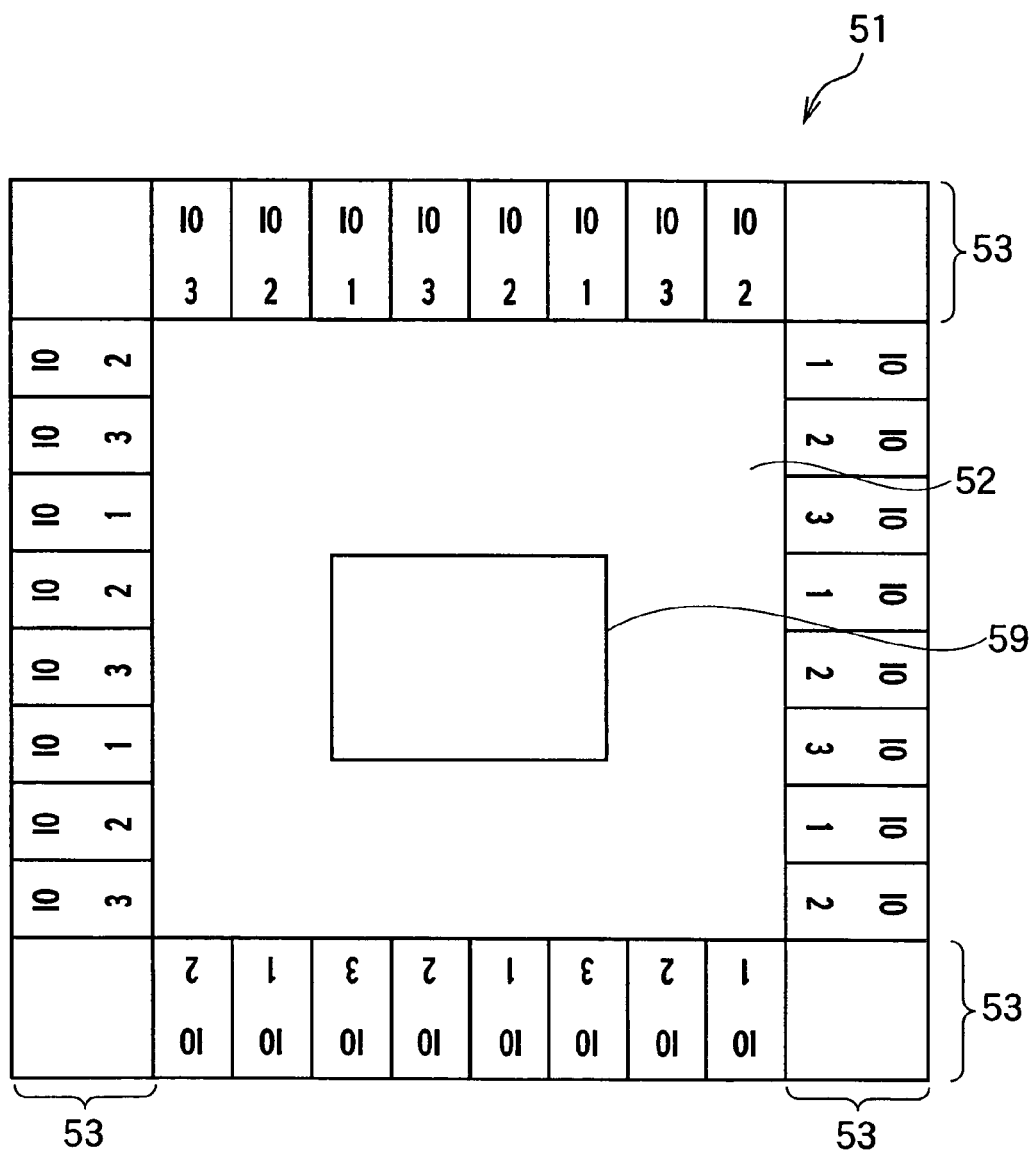
FIG. 21 is a layout of a semiconductor LSI circuit.
Figure 22:
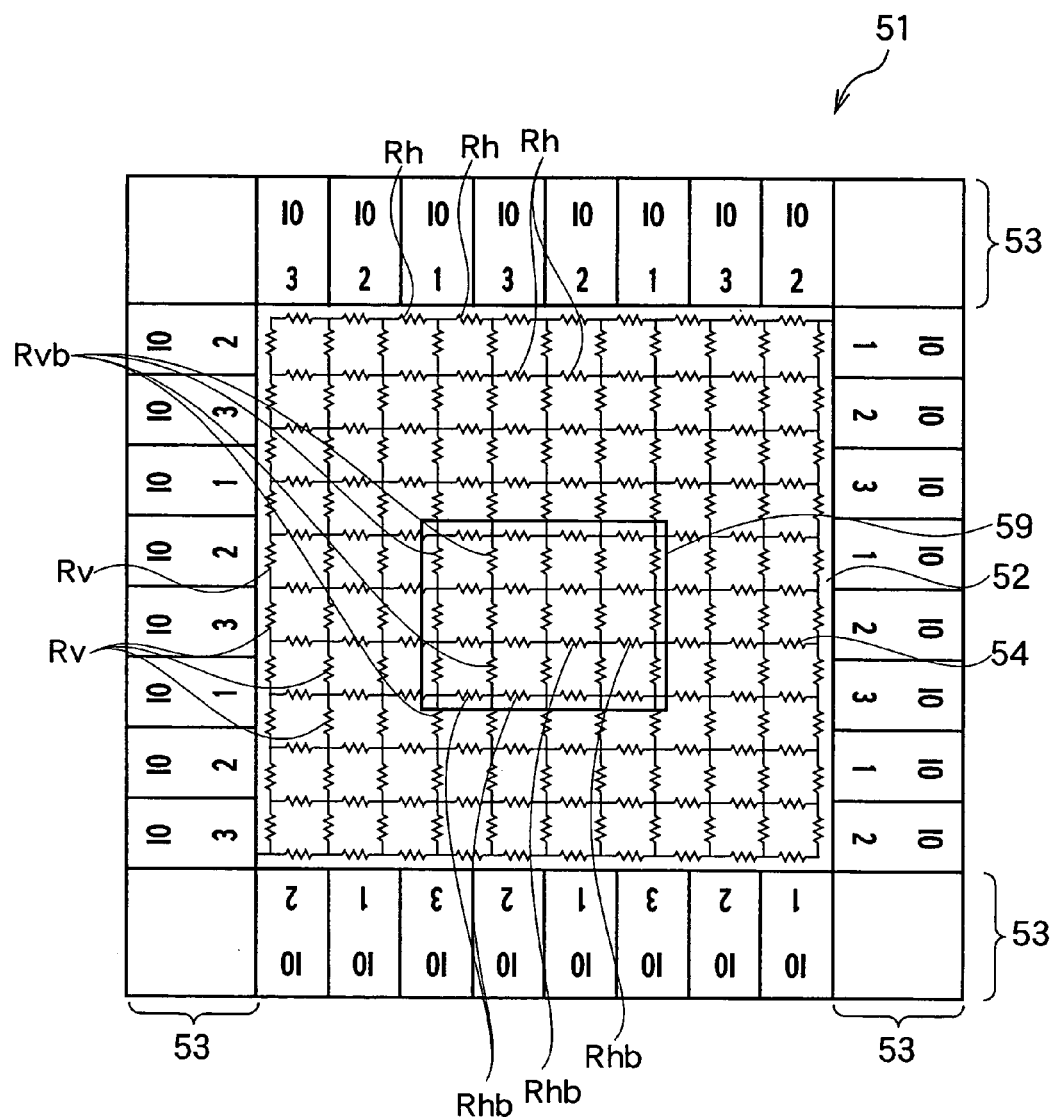
FIG. 22 is a layout of a semiconductor LSI circuit on which internal power supply grid models are placed.

In addition, as shown in FIG. 19, implementation of the ESD analysis in step S4 using block placement information 48 after obtaining that block placement information 48 through the floorplanning in step S2 is effective for accurate ESD analysis. As shown in FIG. 20, the ESD analysis in step S4 is different from that in FIG. 5 in that the block placement information 48 is used to generate the internal power supply grid models in step S5. In step S51 of step S5, as shown in FIG. 21, the logic cell region determination unit 21 further deploys a block region 59 based on the block placement information 48 in comparison with the case of FIG. 8. In addition, the block placement information 48 includes internal power supply grid information on each block region 59 as shown in FIG. 10. As a result, as shown in FIG. 22, in step S57, the combined resistances Rhb and Rvb in the block region 59 can be set with certain values different from the combined resistances Rh and Rv outside of the block region 59, respectively. In this way, a more accurate internal power supply grid model 45 can be generated by changing the combined resistances Rh and Rv for each specified block region 59.

As described above, according to the first embodiment, a semiconductor LSI circuit ESD analysis apparatus that does not need to wait for completion of a layout design can be provided. In addition, according to the first embodiment, a semiconductor LSI circuit ESD analysis program that does not need to wait for completion of a layout design can be provided.

Second Embodiment

A semiconductor LSI circuit electrostatic discharge analysis apparatus 1, according to a second embodiment of the present invention, is the same as that of the first embodiment in FIG. 1.

Figure 23:
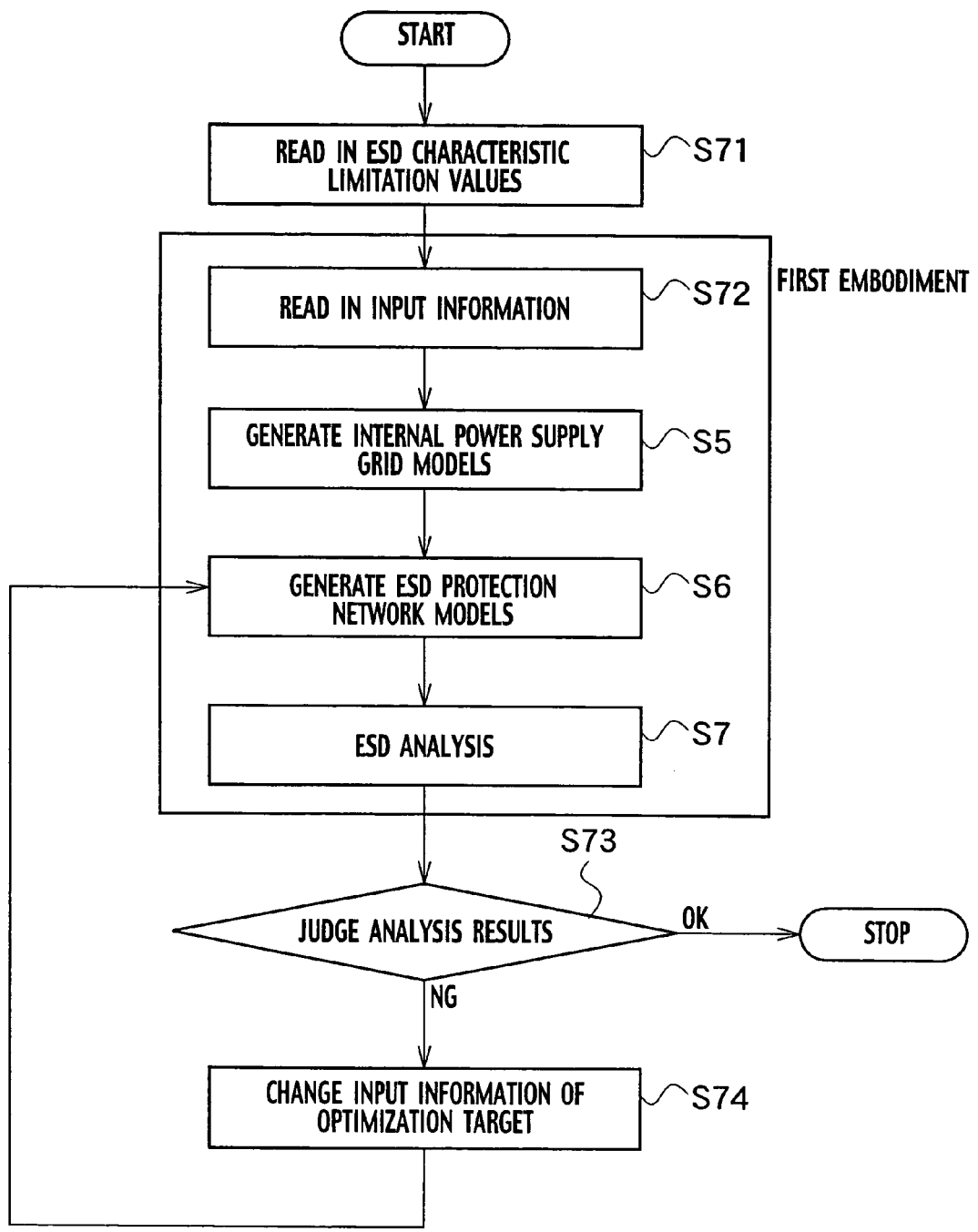
FIG. 23 is a flowchart for a semiconductor LSI circuit electrostatic discharge analysis method according to a second embodiment.

A semiconductor LSI circuit electrostatic discharge analysis method in step S4, according to the second embodiment of the present invention, is implemented with the same timing as that of the first embodiment in FIG. 4. According to the semiconductor LSI circuit electrostatic discharge analysis method in step S4 of the second embodiment, in step S5, the limitation value storage unit 13 in FIG. 1 reads in and stores limitation values of ESD characteristic values such as inter-pad voltages, as shown in FIG. 23.

In step S72, the internal power supply grid information storage unit 8, the internal power supply grid model generation unit 2, and the protection element information storage unit 10 read in and store the internal power supply grid information 44, the I/O cell placement information 41, and the protection element information 43 as input information. As with the first embodiment, steps S5 through S7 or internal power supply grid model generation, ESD protection network model generation, and ESD analysis are carried out.

In step S73, the analysis result judgment unit 6 in FIG. 1 determines whether or not the analysis results of the ESD characteristic values such as inter-pad voltages fall within a range of ESD characteristic limitation values. If yes, this process using the semiconductor LSI circuit electrostatic discharge analysis method in step S4 of the second embodiment stops.

Figure 24:
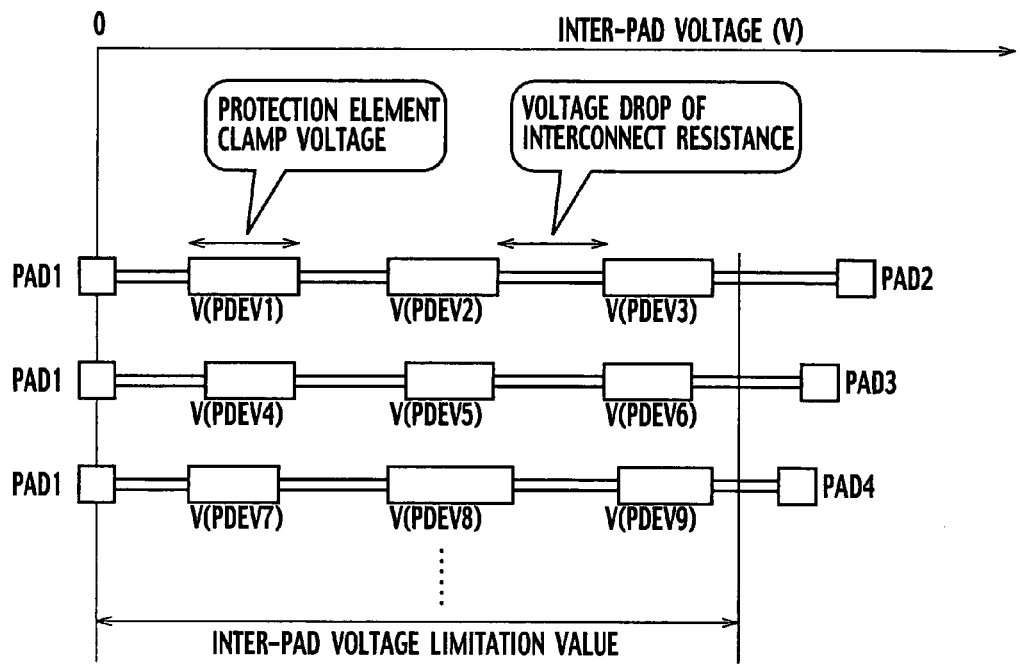
FIG. 24 is a graph showing inter-pad voltages prior to changing protection element information of protection elements.

Otherwise, if no, this process proceeds to step S74. For example, as shown in FIG. 24, the inter-pad voltages between the pads PAD1 and PAD2, between the pads PAD1 and PAD3, and between the pads PAD1 and PAD4, respectively, are higher than the inter-pad voltage limitation value. Therefore, the inter-pad voltages fall outside of that range. Subsequently, the protection element changing unit 7 in FIG. 1 changes the input information of an optimization target. An exemplary protection element size changing method to be used after ESD analysis for optimizing the protection element size is described below. Information of current paths among all pads is obtained through the ESD analysis in step S7. The clamp voltage of each protection element along the current path and voltage drop of each interconnect between each protection element as shown in FIG. 24 can be recognized from the current path information. The following constraint or Expression (5) is obtained according to each current path. Each protection element size is optimized so as to minimize the total of all protection element sizes Σ (protection element sizes) under that constraint, thereby determining each protection element size.

$$\Sigma(\text{protection element clamp voltage}) + \Sigma(\text{voltage drop of interconnect resistance}) < (\text{inter-pad voltage limitation value}) \quad (5)$$

Figure 25:
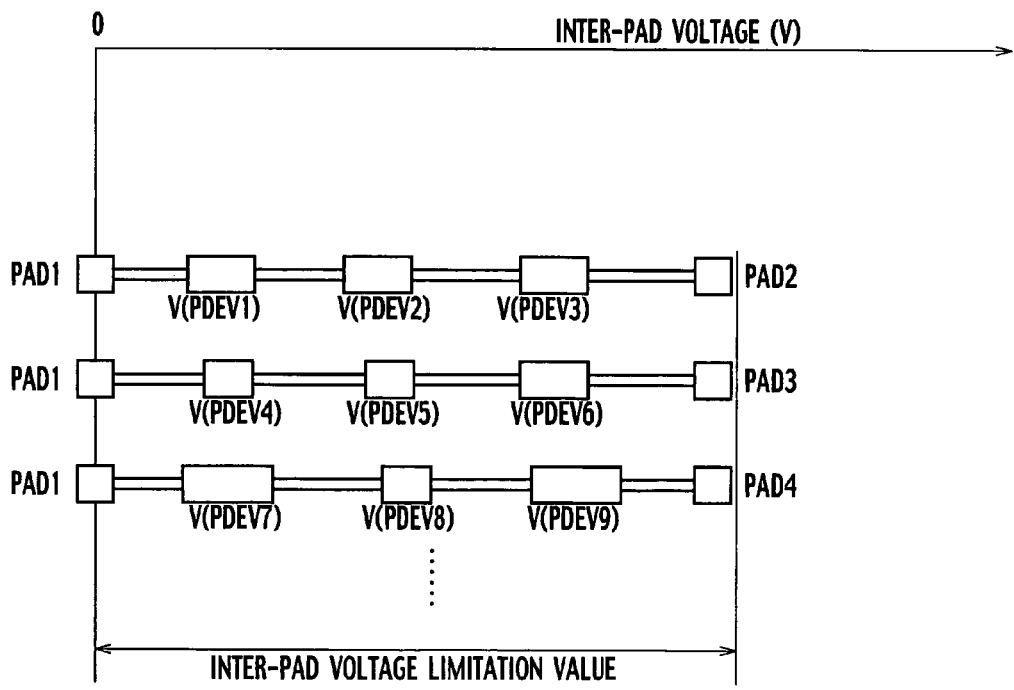
FIG. 25 is a graph showing inter-pad voltages after changing protection element information of protection elements.

For example, as to the inter-pad voltage between the pads PAD1 and PAD2, as shown in FIG. 25, the clamp voltages V(PDEV1), V(PDEV2), and V(PDEV3) of the respective protection elements PDEV1, PDEV2, and PDEV3 have to be decreased. Accordingly, the sizes of the respective protection elements PDEV1, PDEV2, and PDEV3 are increased. Similarly, as to the inter-pad voltage between the pads PAD1 and PAD3, the clamp voltages V(PDEV4), V(PDEV5), and V(PDEV6) of the respective protection elements PDEV4, PDEV5, and PDEV6 have to be decreased. Accordingly, the sizes of the protection elements PDEV4, PDEV5, and PDEV6 are increased. As to the inter-pad voltage between the pads PAD1 and PAD4, the clamp voltage V(PDEV8) of the protection element PDEV8 has to be decreased. Accordingly, the size of the protection element PDEV8 is increased.

ESD protection network model generation in step S6 and ESD analysis in step S7 according to the first embodiment are carried out again. A loop of ESD protection network model generation in step S6, ESD analysis in step S7, analysis result judgment in step S73, and changing of input information of the optimization target in step S74 is repeated, optimizing input information of the optimization target, such as protection element size. Optimizing internal power supply grids, an I/O cell placement, and protection elements while satisfying the ESD characteristic limitation values is possible.

As described above, a semiconductor LSI circuit ESD analysis apparatus, according to the second embodiment, which does not need to wait for completion of a layout design can be provided. In addition, a semiconductor LSI circuit ESD analysis program according to the second embodiment which does not need to wait for completion of a layout design can be provided.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor integrated circuit electrostatic discharge analysis apparatus comprising:
  a resistance network generation unit configured to generate a resistance network as a power supply interconnect equivalent circuit by using an interconnect pitch, an interconnect width and a sheet resistance of a power supply interconnect, in an entire logic cell region of a semiconductor LSI circuit;

a protection network generation unit configured to generate an electrostatic discharge protection network including pads and protection elements, which are placed in an I/O cell region of a semiconductor LSI circuit, connected to the resistance network; and an analysis unit configured to calculate an inter-pad voltage between the pads when an electrostatic discharge equivalent current flows between the pads, in a design stage of I/O placement carried out before arranging logic cells; wherein the resistance network generation unit comprises: a logic cell region determination unit to arrange the logic cell region;

a grid generation unit generating grids of the resistance network with a horizontal grid interval and a vertical grid interval in the logic cell region; and a combined resistance deployment unit deploying horizontally combined resistance along the horizontal line of the grids, and vertically combined resistance along the vertical line of the grids.

2. The apparatus of claim 1, wherein the resistance network comprises:

a power supply interconnect equivalent circuit configured to be set at the power supply potential; and a power supply equivalent interconnect circuit configured to be set at the ground potential.

3. The apparatus of claim 1, wherein the resistance network generation unit further comprises:

a horizontally combined resistance calculation unit calculating horizontally combined resistance from horizontally arranged interconnect layers associated with the power supply interconnect; and a vertically combined resistance calculation unit calculating vertically combined resistance from vertically arranged interconnect layers.

4. The apparatus of claim 3, wherein the horizontally combined resistance calculation unit calculates the horizontally combined resistance of horizontal resistance cells with a horizontal width equal to the horizontal grid interval and a vertical width equal to the vertical grid interval, the horizontal resistance cells are deployed at positions to which unit cells of the grids are vertically shifted by half a grid;

the vertically combined resistance calculation unit calculates the vertically combined resistance of vertical resistance cells with a horizontal width equal to the horizontal grid interval and a vertical width equal to the vertical grid interval, the vertical resistance cells are deployed at positions to which the unit cells are horizontally shifted by half a grid; and the combined resistance deployment unit deploys the horizontally combined resistance along a horizontal line of the unit cell which overlaps the horizontal resistance cells, and the vertically combined resistance along a vertical line of the unit cell which overlaps the vertical resistance cells.

5. The apparatus of claim 4, wherein the resistance network generation unit further comprises:

a horizontal resistance cell generation unit generating the horizontal resistance cells; and a vertical resistance cell generation unit generating the vertical resistance cells.

6. The apparatus of claim 3, wherein:

the horizontally combined resistance has a resistance value of horizontal layer resistances connected in parallel in the respective horizontally arranged interconnect layers; and the vertically combined resistance has a resistance value of vertical layer resistances connected in parallel in the respective vertically arranged interconnect layers.

7. The apparatus of claim 6, wherein:

the horizontal layer resistances are calculated using the interconnect pitch and interconnect width for the horizontally arranged interconnect layers; and the vertical layer resistances are calculated using the interconnect pitch and interconnect width of the vertically arranged interconnect layers.

8. The apparatus of claim 1, wherein the protection network generation unit comprises an I/O cell region generation unit generating the I/O cell regions to place I/O cells used for the semiconductor LSI circuit based on I/O cell placement information.

9. The apparatus of claim 8, wherein the I/O cell region generation unit generates the I/O cell region before arranging the logic cell region by the logic cell region determination unit.

10. The apparatus of claim 8, wherein the protection network generation unit further comprises:

a cell model arranging unit configured to arrange ESD analysis I/O cell models corresponding to the respective I/O cells in the I/O cell regions, the ESD analysis I/O coil models includes protection elements, pads, distributed resistances of power supply rings connected to each other, and relations of connections of distributed resistances, the protection elements and the pads with respect to the resistance network; and a connection unit connecting the ESD analysis I/O cell models to the resistance network.

11. The apparatus of claim 10, wherein the protection network generation unit further comprises a protection element changing unit changing the protection elements with a size and a type in the arranged ESD analysis I/O cells based on protection element information including readable variable protection element sizes and types.

12. The apparatus of claim 1, further comprising:

a limitation value storage unit storing inter-pad voltage limitation values; and an analysis result judgment unit judging whether the inter-pad voltage is within a limitation values, wherein, when the inter-pad voltage is not within the limitation values, the protection element changing unit changes the protection element size.

13. The apparatus of claim 1, wherein the analysis unit comprises a shortest path determination unit determining a current path for the current flowing between the pads.

14. A computer implemented method of analyzing semiconductor integrated circuit electrostatic discharge comprising:

generating a resistance network as a power supply interconnect equivalent circuit in an entire logic cell region of a semiconductor LSI circuit by using an interconnect pitch, an interconnect width and a sheet resistance of a power supply interconnect;

generating a electrostatic discharge protection network including pads and protection elements placed in an I/O cell region of the semiconductor LSI circuit, connected to the resistance network; and calculating an inter-pad voltage when electrostatic discharge equivalent current flows between the pads, in a design stage of I/O placement carried out before arranging logic cells; wherein generating the resistance network comprises:

deploying the logic cell region;

generating grids of the resistance network with a horizontal grid interval and a vertical grid interval in the logic cell region; and deploying horizontally combined resistance along a horizontal line of the grids, and vertically combined resistance along a vertical line of the grids.

15. The computer implemented method of claim 14, wherein generating the resistance network further comprises:

calculating horizontally combined resistance from the horizontally arranged interconnect layers to which the power supply interconnect belongs; and calculating vertically combined resistance from the vertically arranged interconnect layers.

16. The computer implemented method of claim 14, wherein generating the electrostatic discharge protection network comprises:

generating the I/O cell regions to be used for the semiconductor LSI circuit;

arranging in the I/O cell regions, ESD analysis I/O cell models corresponding to the I/O cells including protection elements, pads and distributed resistances of power supply rings connected to each other, and relations of connections of the distributed resistances, the protection elements and the pads connected to the resistance network; and connecting the ESD analysis I/O cell models and the resistance network based on The ESD analysis I/O cell library.

17. A computer program product stored on a computer-readable medium of a computer for analyzing a semiconductor integrated circuit electrostatic discharge, the computer program product comprising:

an instruction to generate grids of a resistance network with horizontal grid interval and vertical grid interval in an entire logic cell region of the semiconductor integrated circuit;

an instruction to calculate horizontally combined resistance of horizontal resistance cells from horizontally arranged interconnect layers associated with a power supply interconnect of the semiconductor LSI circuit;

an instruction to calculate vertically combined resistance of vertical resistance cells from vertically arranged interconnect layers; and an instruction to deploy horizontally combined resistance along a horizontal line of the grids, and vertically combined resistance along a vertical line of the grids.

18. The computer program product of claim 17 further comprising:

an instruction to generate horizontal resistance cells with a horizontal grid interval and a vertical grid interval deployed at positions to which unit cells of the grids are vertically shifted by half a grid; and an instruction to generate vertical resistance cells with a horizontal grid interval and a vertical grid interval deployed at positions to which unit cells are horizontally shifted by half a grid, wherein, the instruction to calculate the horizontally combined resistance comprises calculating the horizontally combined resistance of the horizontal resistance cells, and the instruction to calculate the vertically combined resistance comprises calculating the vertically combined resistance comprises calculating the vertically combined resistance of the vertical resistance cells.

19. The computer program product of claim 17, wherein:

the horizontally combined resistance has a resistance value of horizontal layer resistances connected in parallel in respective horizontally arranged interconnect layers; and the vertically combined resistance has a resistance value of vertical layer resistances connected in parallel in respective vertically arranged interconnect layers.

* * * * *